(12) United States Patent
Sohara

(10) Patent No.: US 7,880,314 B2
(45) Date of Patent: Feb. 1, 2011

(54) WIRING SUBSTRATE AND ELECTRONIC COMPONENT MOUNTING STRUCTURE

(75) Inventor: Tsuyoshi Sohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 240 days.

(21) Appl. No.: 12/330,946

(22) Filed: Dec. 9, 2008

(65) Prior Publication Data
US 2009/0152716 A1 Jun. 18, 2009

(30) Foreign Application Priority Data
Dec. 12, 2007 (JP) .............................. 2007-321390

(51) Int. Cl.
*H01L 23/48* (2006.01)
(52) U.S. Cl. ................. 257/778; 257/700; 257/734; 257/776; 257/E23.068; 257/E21.511; 257/E21.503
(58) Field of Classification Search ................ 257/734, 257/778, E21.499, E21.503, E21.506, E21.511, 257/667, 700–704, 774, 776, E23.068
See application file for complete search history.

(56) References Cited

U.S. PATENT DOCUMENTS 6,710,458 B2 * 3/2004 Seko ........................ 257/778
2004/0169275 A1 * 9/2004 Danvir et al. ............. 257/737
2005/0073038 A1 * 4/2005 Kuo et al. .................. 257/690
2006/0091542 A1 * 5/2006 Zhao et al. ................. 257/738

FOREIGN PATENT DOCUMENTS

| JP | 11-186322 | 7/1999 |
| JP | 2000-77471 | 3/2000 |

* cited by examiner

*Primary Examiner*—Jasmine J Clark
(74) *Attorney, Agent, or Firm*—Rankin, Hill & Clark LLP

(57) ABSTRACT

A wiring substrate on which an electronic component is flip-chip bonded, including a substrate main body, a solder resist which is formed on the substrate main body and having an opening, and a plurality of conductive pattern formed on the substrate main body, including exposure surfaces exposed from the opening of the solder resist. The conductive patterns include, a narrow interval group, a wide interval group, an interval between the adjacent conductive patterns belonging to the narrow interval group is narrower than an interval between the adjacent conductive patterns belonging to the wide interval group, an exposure length of the conductive patterns of the narrow interval group is shorter than an exposure length of the conductive patterns of the wide interval group.

14 Claims, 9 Drawing Sheets

US 7,880,314 B2

WIRING SUBSTRATE AND ELECTRONIC COMPONENT MOUNTING STRUCTURE

This application claims priority from Japanese Patent Application No. P.2007-321390, filed Dec. 12, 2007 in the Japanese Patent Office, the entire disclosure of which is incorporated herein by reference.

BACKGROUND OF THE INVENTION

1. Field of the Invention

The present invention relates to a wiring substrate on which an electronic component is flip-chip bonded and an electronic component mounting structure.

2. Description of Related Art

There is know a semiconductor device in which a semiconductor element 102 is mounted on one surface side of a wiring substrate 100 in which wiring patterns are stacked in a multi-layered fashion, and solder balls 110, 110 as external connection terminals are mounted on the other surface side of the wiring substrate 100, as shown in FIG. 6.

In this semiconductor device, in a mounting surface of the wiring substrate 100 on which the semiconductor element 102 is mounted, tip ends of bumps formed on electrode terminals 102a, 102a of the semiconductor element 102 contact with conductive patterns 106 and then they are bonded by solder 108.

In this semiconductor device, an underfill resin 112 is filled in a clearance between a surface of the wiring substrate 100 and the semiconductor element 102.

In the semiconductor device shown in FIG. 6, the conductive patterns 106, 106 are formed on the mounting surface of the wiring substrate 100 so as to be exposed at a position where the tip ends of the bumps 104, 104 of the semiconductor device 102 as shown in FIG. 7. In the conductive pattern 106, a wide portion 106a of which width is wider than other portions is formed in a middle portion of the conductive pattern 106. The tip end of the bump 104 of the semiconductor device 102 comes into contact with the wide portion 106a.

Both ends of the conductive pattern 106, 106 are covered with solder resists 114, 116.

When the semiconductor element 102 is flip-chip bonded on the mounting surface of the wiring substrate 100 shown in FIG. 7, Japanese Patent Unexamined Publications JP-A-11-186322 and JP-A-2000-77471 proposes following bonding methods.

That is, solder powders are applied to whole exposed surfaces of the conductive patterns 106, 106, then the solder powders are fused to cover the wide portion 106a of the conductive pattern 106 with fused solder, and then the tip end of the bump 104 of the semiconductor element 102 is brought into contact with the wide portions 106a of the conductive patterns 106. At this time, the solder 108 covering whole exposed surfaces of the conductive patterns 106 gathers around peripheral surfaces of the bumps 104 respectively due to a surface tension, then, the gathered solder becomes solidified and joins together the bumps 104 and the conductive patterns 106.

According to the semiconductor element mounting structure proposed in JP-A-11-186322 and JP-A-2000-77471, the solder that covers whole exposed surfaces of the conductive patterns 106 can be utilized in joining the bumps 104 of the semiconductor element 102 and the conductive patterns 106. Thus, both can be connected electrically without fail.

However, the conductive patterns 106, 106 exposed on the mounting surface of the wiring substrate 100 are formed sometimes such that, as shown in FIG. 8, the interval between adjacent conductive patterns 106, 106 becomes narrow or wide depending upon the relationship to the electrode terminals 102a, 102a of the mounted semiconductor element 102.

In such situation, as shown in FIG. 8, if respective exposed lengths of the conductive patterns 106, 106 are equal mutually, when bringing the tip end of the bump 104 of the semiconductor device 102 into contact with the wide portion 106a of the conductive pattern 106 which is covered with fused solder, in a region where an interval between the adjacent conductive pattern 106 is narrow, as shown in FIG. 9, the solder 108 which is gathered around the adjacent bumps 104 approaches each other and there is a possibility of contacting each other. This causes shortcircuit between the electrode terminals 102a, 102a.

SUMMARY OF THE INVENTION

In order to solve the problem, the inventor of the present invention has found the fact that an amount of brazing metal that covers exposed surfaces of adjacent conductive patterns must be adjusted and thus an amount of the brazing metal can be adjusted easily by adjusting an exposed length of the conductive pattern, and has arrived at the present invention.

According to an aspect of the invention, there is provided a wiring substrate on which an electronic component is flip-chip bonded, including:

a substrate main body;

a solder resist which is formed on the substrate main body and having an opening; and a plurality of conductive pattern formed on the substrate main body, including exposure surfaces exposed from the opening of the solder resist, wherein the conductive patterns include a narrow interval group and a wide interval group, an interval between the adjacent conductive patterns belonging to the narrow interval group being narrower than an interval between the adjacent conductive patterns belonging to the wide interval group, and an exposure length of the conductive patterns of the narrow interval group is shorter than an exposure length of the conductive patterns of the wide interval group.

Further, according to another aspect of the present invention, there is provided an electronic component mounting structure including:

an electronic component having bumps;

a substrate on which the electronic component is mounted;

a solder resist which is formed on the substrate and having an opening; and a plurality of conductive pattern formed on the substrate, including exposure surfaces exposed from the opening of the solder resist, wherein the conductive patterns include a narrow interval group and a wide interval group, an interval between the adjacent conductive patterns belonging to the narrow interval group being narrower than an interval between the adjacent conductive patterns belonging to the wide interval group, an exposure length of the conductive patterns of the narrow interval group is shorter than an exposure length of the conductive patterns of the wide interval group, and each of the bumps are flip-chip bonded to the respective exposure surface of the conductive pattern by brazing metal.

Further, according to another aspect of the invention, both ends of the conductive patterns may be covered with the solder resist, and the exposure length of the conductive pattern may be adjusted by the solder resist.

Further, according to another aspect of the invention, the opening maybe hollow rectangular shape such that the solder resist has a hollow rectangle portion and a solid rectangle portion arranged inside the hollow rectangle portion, and a part of an inner edge of the hollow rectangle portion of the solder resist may protrude inwardly at a position corresponding to the narrow interval group of the conductive pattern.

Still further, according to another aspect of the invention, the opening may be hollow rectangular shape such that the solder resist has a hollow rectangle portion and a solid rectangle portion arranged inside the hollow rectangle portion, and a part of an outer edge of the solid rectangle portion of the solder resist may protrude outwardly at a position corresponding to the narrow interval group of the conductive-pattern.

Furthermore, according to still another aspect of the invention, the opening may be hollow rectangular shape such that the solder resist has a hollow rectangle portion and a solid rectangle portion arranged inside the hollow rectangle portion, a part of an inner edge of the hollow rectangle portion of the solder resist may protrude inwardly at a position corresponding to the narrow interval group of the conductive pattern, and a part of an outer edge of the solid rectangle portion of the solder resist may protrude outwardly at a position corresponding to the narrow interval group of the conductive pattern.

Further, according to another aspect of the invention, the opening may be rectangular shape, a part of an inner edge of opening of the solder resist may protrude inwardly at a position corresponding to the narrow interval group of the conductive pattern.

Further, according to another aspect of the invention, the conductive pattern may have a wide portion of which width is larger than the other portion of the conductive pattern.

Since the brazing metal powder is applied on the exposed surface of the conductive pattern, an amount of the fused brazing metal is proportional to an exposed square of the conductive pattern. Thus, the amount of the brazing metal applied on the conductive pattern having short exposure length is smaller than the amount of the brazing metal applied on the conductive pattern having long exposure length. When bonding the bump of the electronic component to the exposure surface of the conductive pattern, shortcircuit between terminals is caused at an area of the narrow interval group of the conductive pattern.

Taking into account of these aspects, according to the present invention, the exposure lengths of the conductive patterns belonging to the narrow interval group are set shorter than that belonging to the wide interval group. Thus, the amount of the brazing metal applied on the conductive patterns belonging to the narrow interval group is small and the shortcircuit between the terminals can be surely avoided.

DETAILED DESCRIPTION OF EXEMPLARY EMBODIMENTS OF THE PRESENT INVENTION

Figure 1:
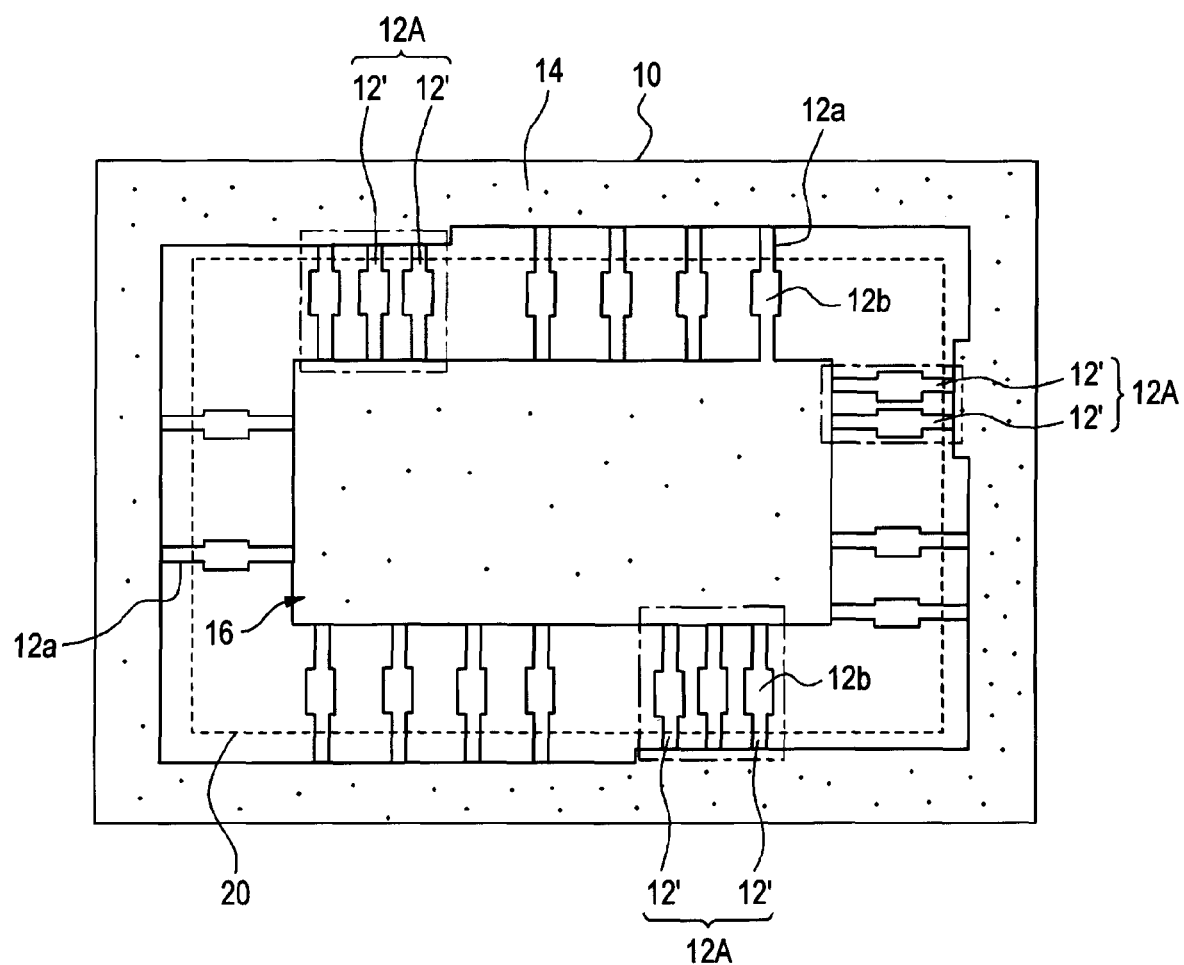
FIG. 1 is a front view explaining an example of a wiring substrate according to the present invention.
Figure 6:
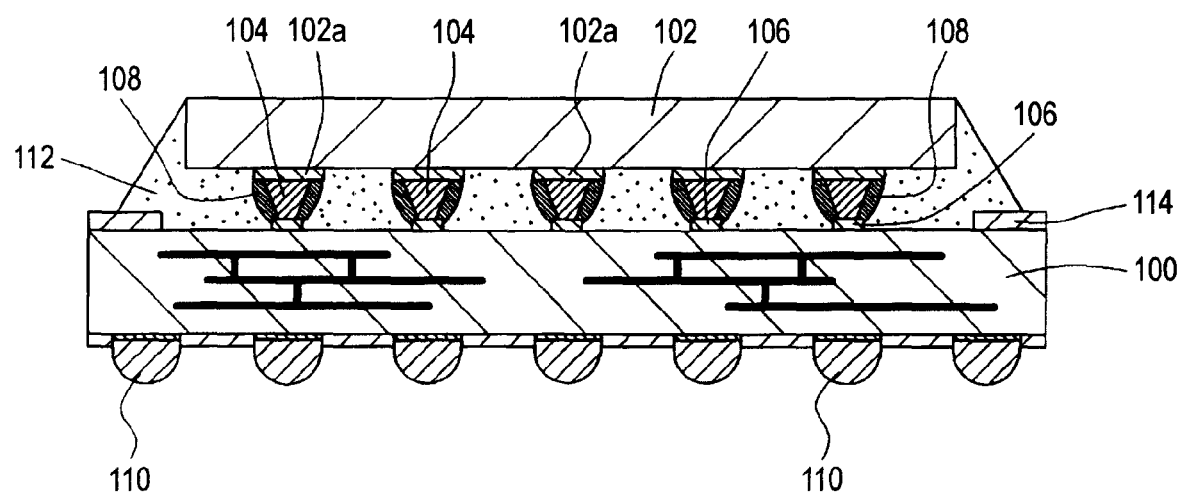
FIG. 6 is a sectional view explaining a semiconductor device in which a semiconductor element is mounted on a mounting surface of a wiring substrate in the related art.
Figure 7:
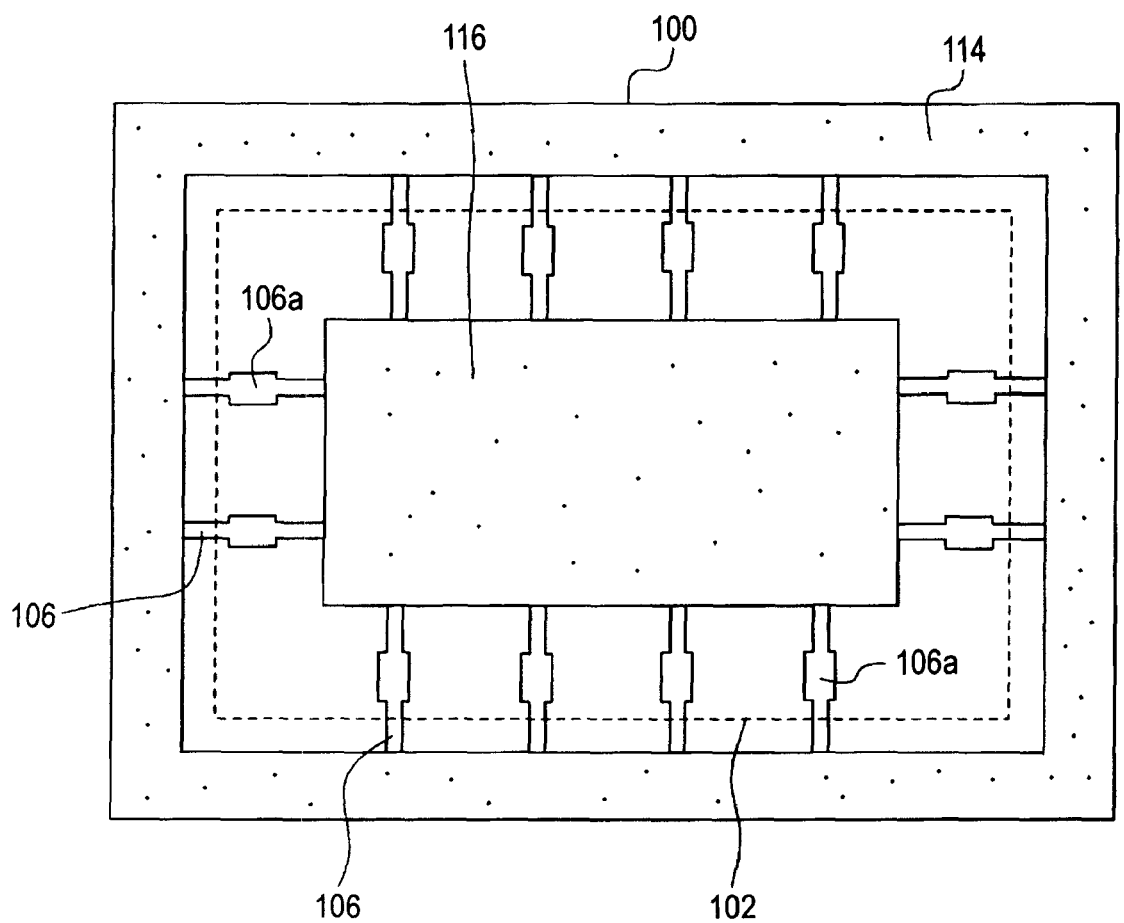
FIG. 7 is a front view showing the wiring substrate shown in FIG. 6.
Figure 8:
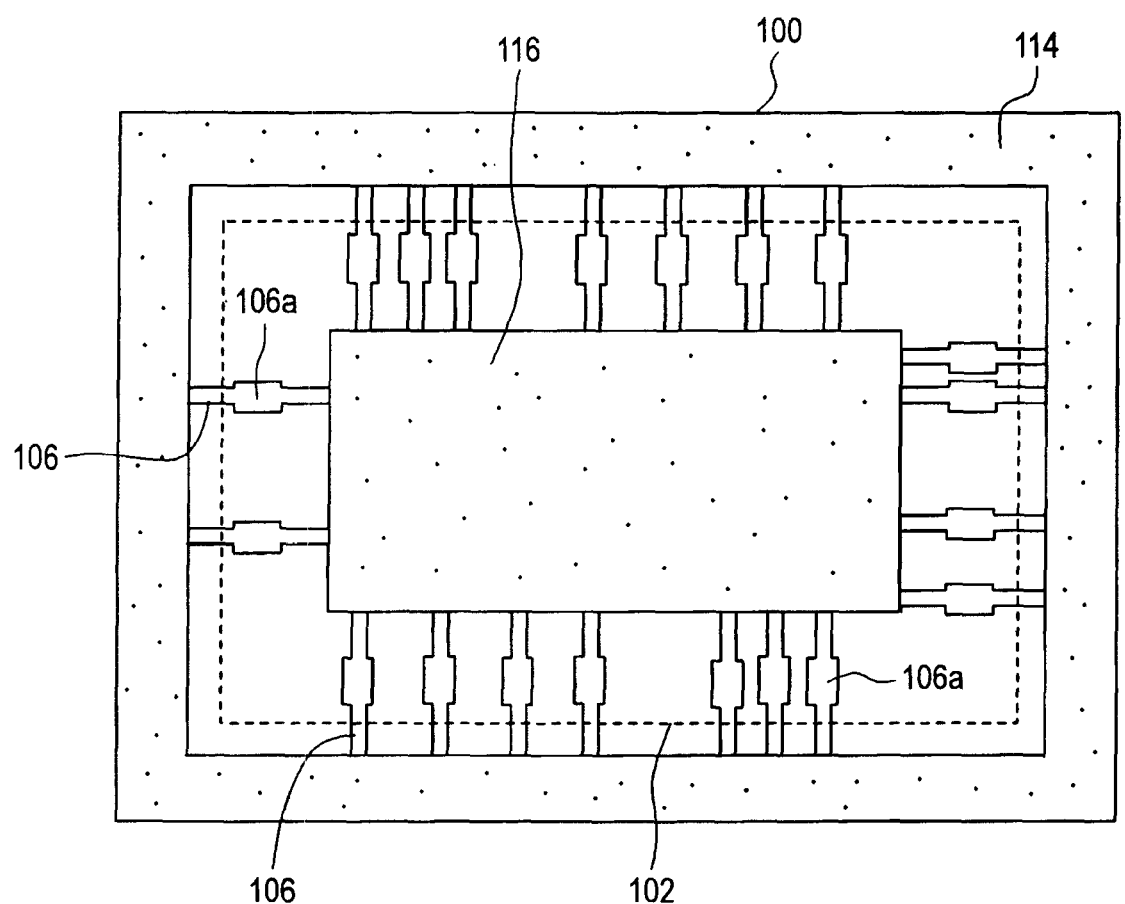
FIG. 8 is a front view showing another example of the wiring substrate in the related art.
Figure 9:
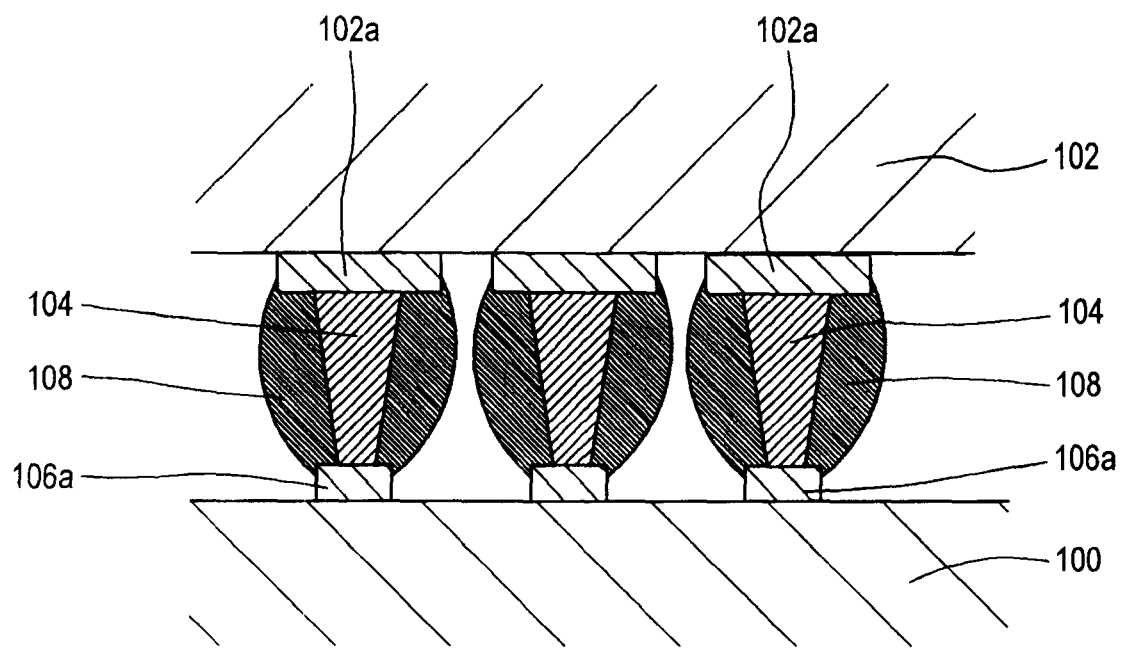
FIG. 9 is a partial sectional view explaining a state that a semiconductor element is mounted on a mounting surface of the wiring substrate shown in FIG. 8 in the related art.

An example of a mounting surface, on which a semiconductor element as an electronic component is mounted, formed on one surface side of a wiring substrate according to the present invention, is shown in FIG. 1. In a wiring substrate 10 shown in FIG. 1, a wiring pattern is stacked in a multilayered fashion, like the wiring substrate shown 100 in FIG. 6.

One surface side of the wiring substrate 10 shown in FIG. 1 is formed as a mounting surface on which a semiconductor element 20 as an electronic component is mounted. A plurality of conductive patterns 12, 12 are formed in a frame-like space between an outside solder resist 14 shaped like a frame and an inside solder resist 16 formed inside the solder resist 14 on the mounting surface to expose therefrom. That is, an exposure surface of the conductive patterns 12, 12 are exposed from on opening of the solder resist 14, 16.

A wide portion 12b whose width is wider than other portions of the conductive pattern 12 is formed in the conductive patterns 12, 12 respectively. Tip ends of the bumps protruded from the electrode terminals of the semiconductor element 20 come into contact with the wide portions 12b respectively.

As shown in FIG. 1, an interval between exposed surfaces of adjacent conductive patterns 12', 12' in the portion encircled with a dot-dash line is narrower than an interval between exposed surfaces of other adjacent conductive patterns 12a, 12a. Such conductive patterns 12', 12' whose interval between exposed surfaces is narrow constitute a narrow interval group 12A of the conductive pattern.

In contrast, other conductive patterns 12a, 12a whose interval between exposed surfaces is wider than an interval between exposed surfaces of adjacent conductive patterns 12', 12' constitute a wide interval group of the conductive pattern.

Exposed lengths of the conductive patterns 12', 12' constituting the narrow interval group 12A of the conductive pattern shown in FIG. 1 are formed shorter than the exposed lengths of other conductive patterns 12a, 12a constituting the wide interval group of the conductive pattern. Here, the exposed length is defined in a direction in which the conductive pattern 12 extends from an edge of the opening of the solder resist 14, 16.

In the wiring substrate 10 shown in FIG. 1, a portion of the outside solder resist 14 corresponding to the narrow interval group 12A of the conductive pattern protrudes partially inwardly the solder resist 16. Thus, the exposed lengths of the conductive patterns 12', 12' are shortened.

FIG. 2 shows a state that solder powders are applied to whole exposed surfaces of the conductive patterns 12, 12, which are exposed from the mounting surface of the wiring substrate 10 shown in FIG. 1, and are fused, then the tip ends of the bumps provided on the electrode terminals of the semiconductor element as the electronic component are brought into contact with the conductive patterns 12, 12 of which whole exposed surfaces are covered with the fused solder, and then the conductive patterns 12 and the bumps of the semiconductor element are joined together.

Figure 2A:
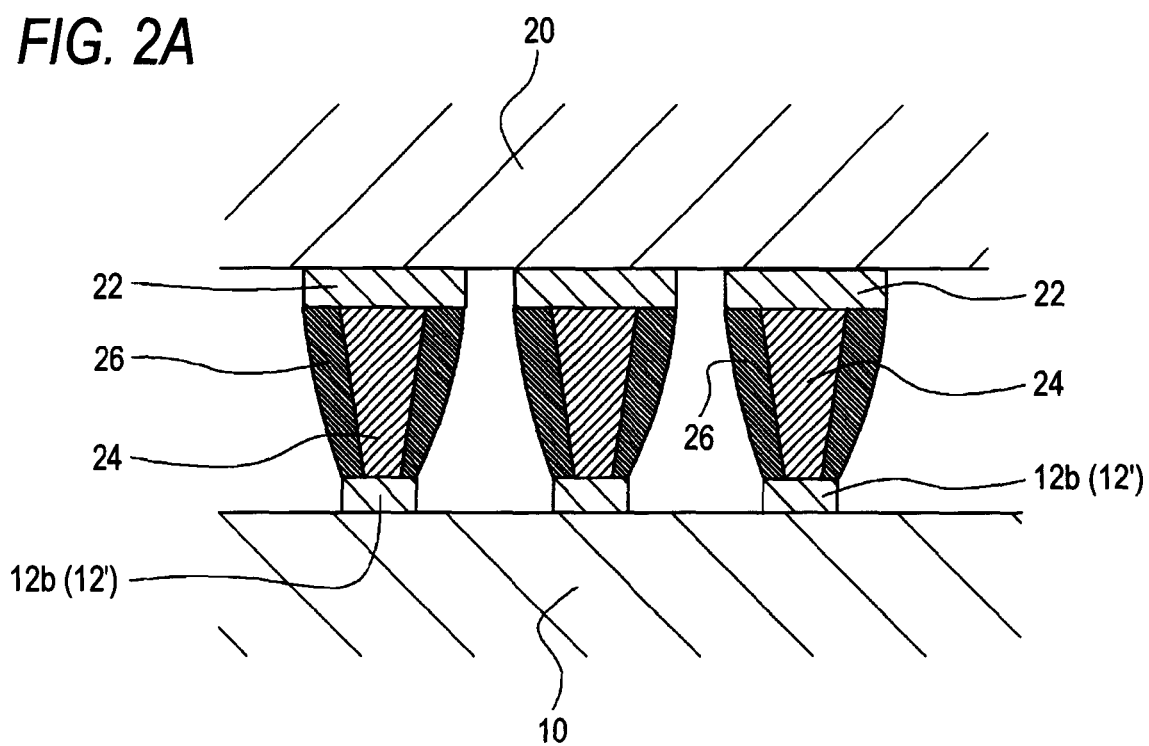
FIG. 2A is a partial sectional view of the wiring substrate of the present invention at a position corresponding to a narrow interval group of the conductive pattern.

FIG. 2A shows a state that bumps 24, 24 provided on electrode terminals 22 of the semiconductor element 20 are joined to the wide portions 12b of the conductive patterns 12', 12' constituting the narrow interval group 12A of the conductive pattern.

The exposed lengths of the conductive patterns 12', 12' constituting the narrow interval group 12A of the conductive pattern are shorter than the exposed lengths of the conductive patterns 12a, 12a constituting the wide interval group of the conductive pattern. Therefore, an amount of fused solder that covers respective exposed surfaces of the conductive patterns 12', 12' is smaller than an amount of fused solder that covers respective exposed surfaces of the conductive patterns 12a, 12a.

As a result, as shown in FIG. 2A, when the tip ends of the bumps 24 of the semiconductor element 20 are brought into contact with the wide portions 12b of the conductive patterns 12', 12', of which whole exposed surfaces are covered with the fused solder, an amount of fused solder that gathers around peripheral surfaces of the bumps 24, 24 respectively due to surface tension can be made small. Thus, such a situation can be surely avoided that spherical solders 26, 26 formed around peripheral surfaces of the adjacent bumps 24, 24 come in touch with each other.

Figure 2B:
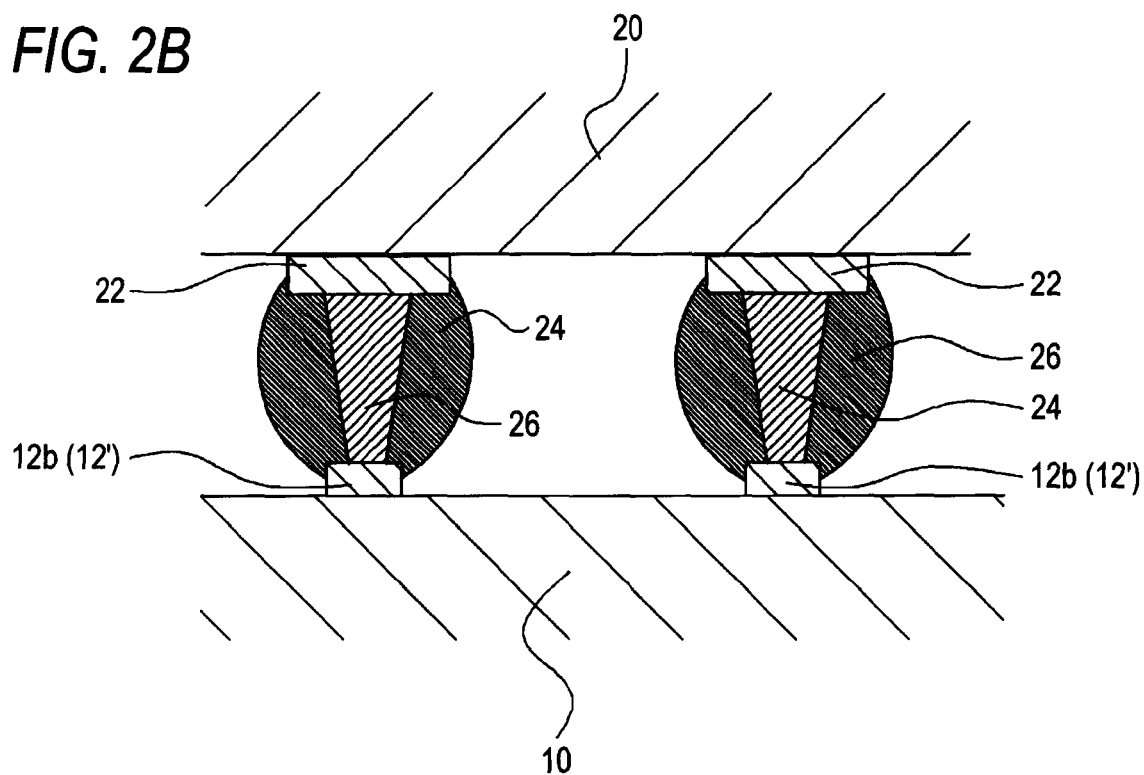
FIG. 2B is a partial sectional view of the wiring substrate of the present invention at a position corresponding to a wide interval group of the conductive pattern.

In contrast, an amount of fused solder that covers respective exposed surfaces of the conductive patterns 12a, 12a can be made larger than an amount of fused solder that covers respective exposed surfaces of the conductive patterns 12', 12'. Therefore, when the tip ends of the bumps 24 of the semiconductor element 20 are brought into contact with the wide portions 12b of the conductive patterns 12a, 12a of which whole exposed surfaces are covered with the fused solder respectively, an amount of solder that gathers around peripheral surfaces of the bumps 24 respectively due to surface tension can be increased, as shown in FIG. 2B. Thus, the bumps 24 and the conductive patterns 12a can be joined strongly. In this case, the spherical solders 26, 26 formed around mutually adjacent bumps 24, 24 are increased in size, nevertheless the interval between the bumps 24, 24 is set sufficiently wide and the spherical solders 26, 26 never come in touch with each other.

In the wiring substrate 10 shown in FIG. 1, the exposed lengths of the conductive patterns 12', 12' constituting the narrow interval group 12A of the conductive pattern are shortened by extending a portion of the outside solder resist 14 corresponding to the narrow interval group 12A of the conductive pattern to the inner side of the solder resist 16. In this case, as shown in FIG. 3, the exposed lengths of the conductive patterns 12', 12' may be shortened by extending a portion of the inside solder resist 16 corresponding to the narrow interval group 12A of the conductive pattern to the outside solder resist 14 side.

That is, the opening of the solder resist 14, 16 is hollow rectangular shape such that the solder resist has a hollow rectangle portion 14 and a solid rectangle portion 16 arranged inside the hollow rectangle portion14, and a part of an inner edge of the hollow rectangle portion 14 of the solder resist protrudes inwardly at a position corresponding to the narrow interval group 12A of the conductive pattern 12.

Figure 4:
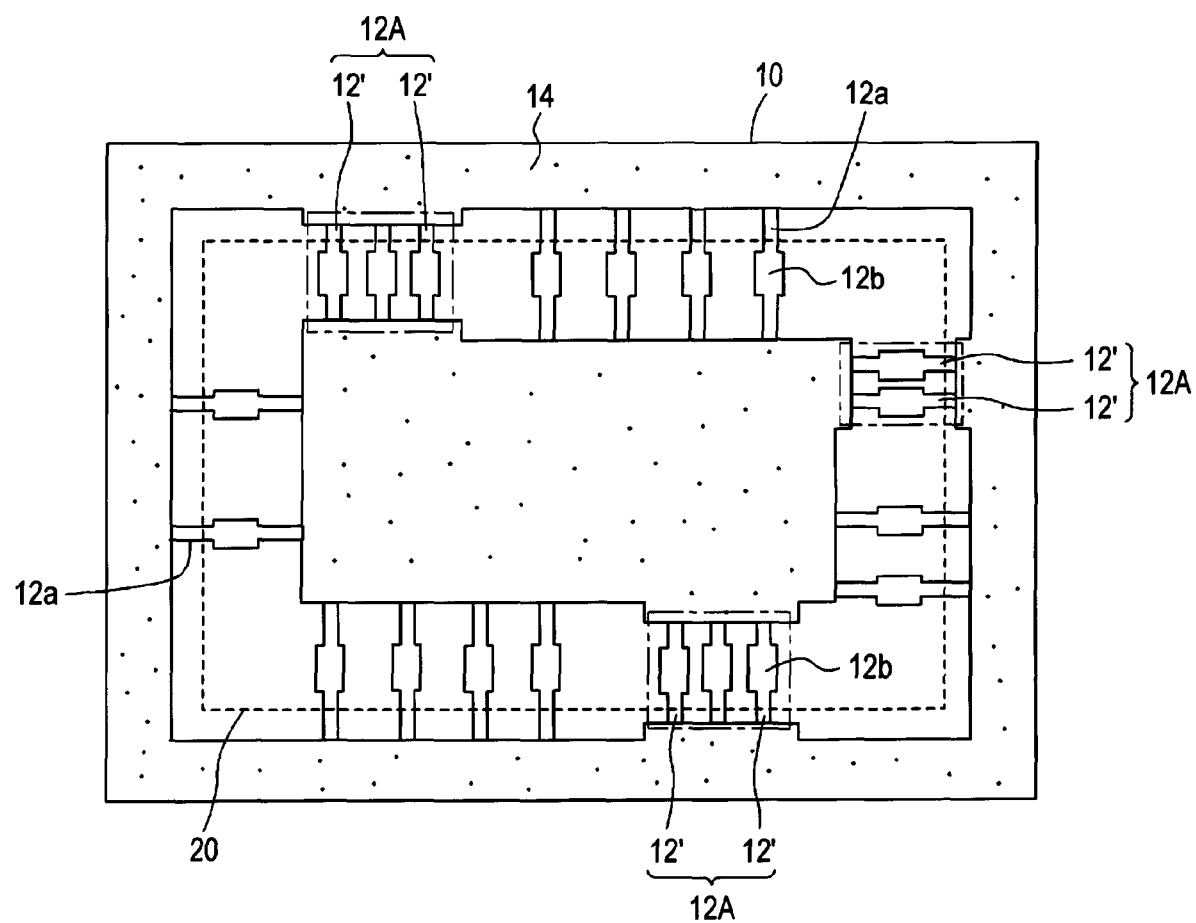
FIG. 4 is a front view explaining still another example of a wiring substrate according to the present invention.

Also, as shown in FIG. 4, even when the portion of the outside solder resist 14 and the portion of the inside solder resist 16 corresponding to the narrow interval group 12A of the conductive pattern are extended, the exposed lengths of the conductive patterns 12' constituting the narrow interval group 12A of the conductive pattern can be shortened.

Figure 3:
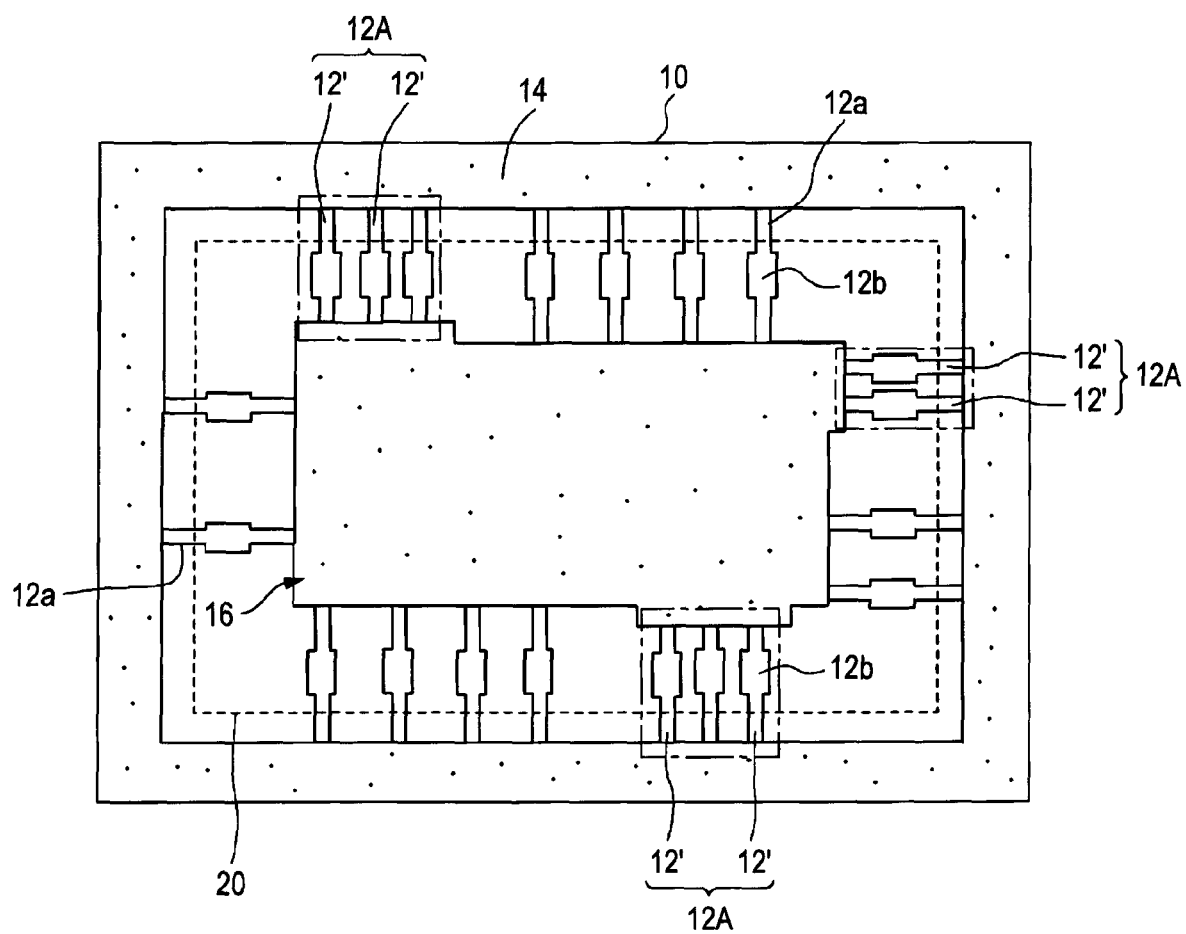
FIG. 3 is a front view explaining another example of a wiring substrate according to the present invention.

In this case, in FIG. 3 and FIG. 4, the same reference numbers as those shown in FIG. 1 are affixed to the same members as those shown in FIG. 1, and their detailed explanation will be omitted herein.

That is, the opening of the solder resist 14, 16 is hollow rectangular shape such that the solder resist has a hollow rectangle portion 14 and a solid rectangle portion 16 arranged inside the hollow rectangle portion 14, and a part of an outer edge of the solid rectangle portion 16 of the solder resist protrudes outwardly at a position corresponding to the narrow interval group 12A of the conductive pattern 12.

Figure 5:
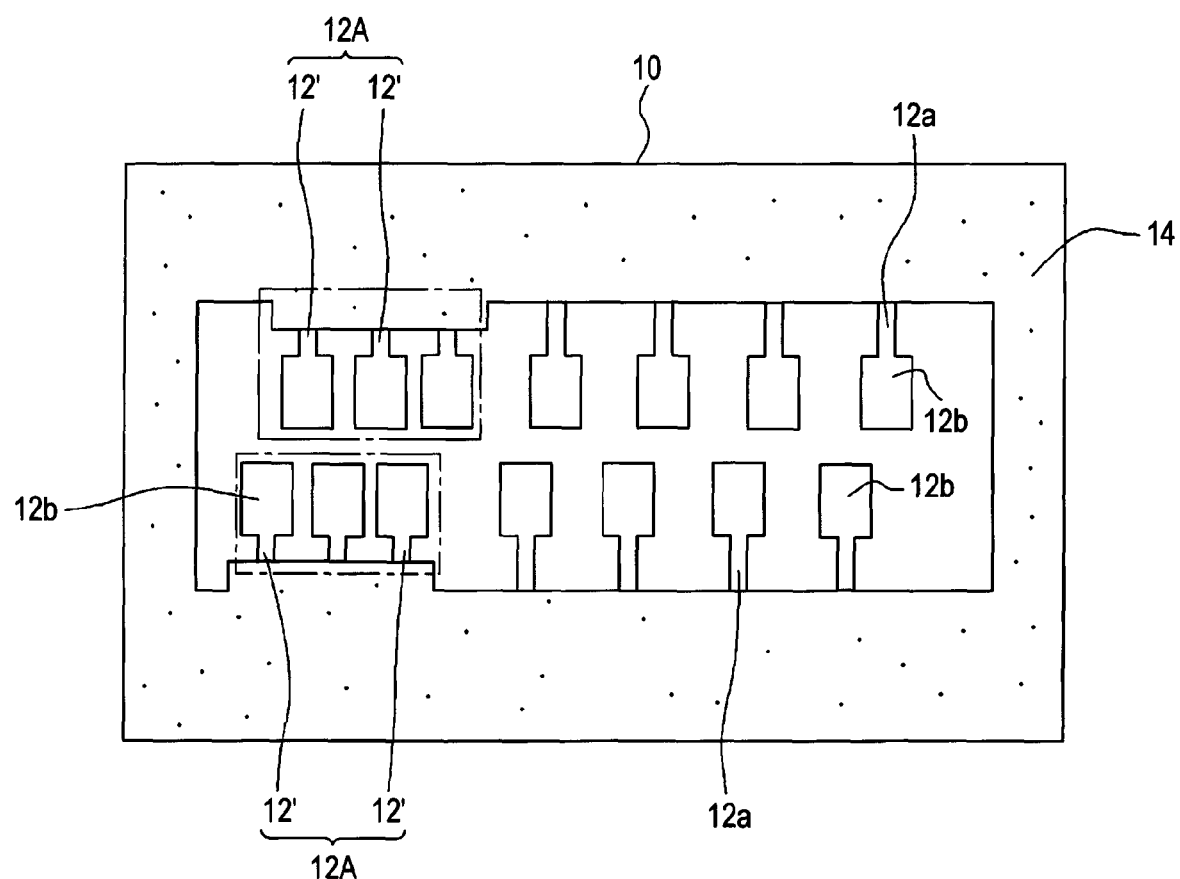
FIG. 5 is a front view explaining still another example of a wiring substrate according to the present invention.

In the mounting surface of the wiring substrate 10 shown in FIG. 1 to FIG. 4, respective exposed surfaces of the conductive patterns 12, 12 are formed along the outer peripheral edge of the wiring substrate 10. In this case, as shown in FIG. 5, respective exposed surfaces of the conductive patterns 12, 12 may be formed in a center portion of the wiring substrate 10. However, in the wiring substrate 10 shown in FIG. 5, the wide portions 12b with which the tip ends of the bumps 24 of the semiconductor element 20 are brought into contact are formed at the end portions of respective exposed surfaces of the conductive patterns 12, 12 and respective rear end portions of the conductive patterns 12, 12 are covered with the outside solder resist 14.

As shown in FIG. 5, an interval between exposed surfaces of the adjacent conductive patterns 12', 12' encircled with a dot-dash line is set narrower than the interval between exposed surfaces of other adjacent conductive patterns 12', 12'. Such conductive patterns 12', 12' in which the interval between adjacent exposed surfaces is set narrow constitute the narrow interval group 12A of the conductive pattern. Also, other conductive patterns 12a, 12a in which the interval between adjacent exposed surfaces is set wider than the interval between adjacent exposed surfaces of the conductive patterns 12', 12' constitute the wide interval group of the conductive pattern.

The exposed lengths of the conductive patterns 12', 12' constituting the narrow interval group 12A of the conductive pattern shown in FIG. 5 are formed shorter than the exposed lengths of other conductive patterns 12a, 12a constituting the wide interval group of the conductive pattern. The exposed lengths of the conductive patterns 12', 12' are shortened by extending a portion of the outside solder resist 14 corresponding to the narrow interval group 12A of the conductive pattern toward the inside direction.

In this case, the wiring substrate 10 shown in FIG. 1 to FIG. 5 can be formed by the publicly known manufacturing method, for example, the build-up method.

While the invention has been described in connection with the exemplary embodiments, it will be obvious to those skilled in the art that various changes and modifications may be made therein without departing from the present invention, and it is aimed, therefore, to cover in the appended claim all such changes and modifications as fall within the true spirit and scope of the present invention.

What is claimed is:

1. A wiring substrate on which an electronic component is flip-chip bonded, comprising:
 a substrate main body;
 a solder resist which is formed on the substrate main body and having an opening; and
 a plurality of conductive pattern formed on the substrate main body, comprising exposure surfaces exposed from the opening of the solder resist, wherein the conductive patterns include a narrow interval group and a wide interval group, an interval between the adjacent conductive patterns belonging to the narrow interval group being narrower than an interval between the adjacent conductive patterns belonging to the wide interval group, and an exposure length of the conductive patterns of the narrow interval group is shorter than an exposure length of the conductive patterns of the wide interval group.

2. The wiring substrate according to claim 1, wherein
both ends of the conductive patterns are covered with the solder resist, and
the exposure length of the conductive pattern is adjusted by the solder resist.

3. The wiring substrate according to claim 1, wherein
the opening is hollow rectangular shape such that the solder resist has a hollow rectangle portion and a solid rectangle portion arranged inside the hollow rectangle portion, and
a part of an inner edge of the hollow rectangle portion of the solder resist protrudes inwardly at a position corresponding to the narrow interval group of the conductive pattern.

4. The wiring substrate according to claim 1, wherein
the opening is hollow rectangular shape such that the solder resist has a hollow rectangle portion and a solid rectangle portion arranged inside the hollow rectangle portion, and
a part of an outer edge of the solid rectangle portion of the solder resist protrudes outwardly at a position corresponding to the narrow interval group of the conductive pattern.

5. The wiring substrate according to claim 1, wherein
the opening is hollow rectangular shape such that the solder resist has a hollow rectangle portion and a solid rectangle portion arranged inside the hollow rectangle portion,
a part of an inner edge of the hollow rectangle portion of the solder resist protrudes inwardly at a position corresponding to the narrow interval group of the conductive pattern, and
a part of an outer edge of the solid rectangle portion of the solder resist protrudes outwardly at a position corresponding to the narrow interval group of the conductive pattern.

6. The wiring substrate according to claim 1, wherein
the opening is rectangular shape,
a part of an inner edge of opening of the solder resist protrudes inwardly at a position corresponding to the narrow interval group of the conductive pattern.

7. The wiring substrate according to claim 1, wherein
the conductive pattern has a wide portion of which width is larger than the other portion of the conductive pattern.

8. An electronic component mounting structure comprising:
an electronic component having bumps;
a substrate on which the electronic component is mounted;
a solder resist which is formed on the substrate and having an opening; and
a plurality of conductive pattern formed on the substrate, comprising exposure surfaces exposed from the opening of the solder resist, wherein
the conductive patterns include a narrow interval group and a wide interval group, an interval between the adjacent conductive patterns belonging to the narrow interval group being narrower than an interval between the adjacent conductive patterns belonging to the wide interval group,
an exposure length of the conductive patterns of the narrow interval group is shorter than an exposure length of the conductive patterns of the wide interval group, and
each of the bumps is flip-chip bonded to the respective exposure surface of the conductive pattern by brazing metal.

9. The electronic component mounting structure according to claim 8, wherein
both ends of the conductive patterns are covered with the solder resist, and
the exposure length of the conductive pattern is adjusted by the solder resist.

10. The electronic component mounting structure according to claim 8, wherein
the opening is hollow rectangular shape such that the solder resist has a hollow rectangle portion and a solid rectangle portion arranged inside the hollow rectangle portion, and
a part of an inner edge of the hollow rectangle portion of the solder resist protrudes inwardly at a position corresponding to the narrow interval group of the conductive pattern.

11. The electronic component mounting structure according to claim 8, wherein
the opening is hollow rectangular shape such that the solder resist has a hollow rectangle portion and a solid rectangle portion arranged inside the hollow rectangle portion, and
a part of an outer edge of the solid rectangle portion of the solder resist protrudes outwardly at a position corresponding to the narrow interval group of the conductive pattern.

12. The electronic component mounting structure according to claim 8, wherein
the opening is hollow rectangular shape such that the solder resist has a hollow rectangle portion and a solid rectangle portion arranged inside the hollow rectangle portion,
a part of an inner edge of the hollow rectangle portion of the solder resist protrudes inwardly at a position corresponding to the narrow interval group of the conductive pattern, and
a part of an outer edge of the solid rectangle portion of the solder resist protrudes outwardly at a position corresponding to the narrow interval group of the conductive pattern.

13. The electronic component mounting structure according to claim 8, wherein
the opening is rectangular shape,
a part of an inner edge of opening of the solder resist protrudes inwardly at a position corresponding to the narrow interval group of the conductive pattern.

14. The electronic component mounting structure according to claim 8, wherein
the conductive pattern has a wide portion of which width is larger than the other portion of the conductive pattern, and
the bump of the electronic component is flip-chip bonded to the wide portion of the conductive pattern by the brazing metal.

* * * * *